(12) United States Patent
Hsu et al.

(10) Patent No.: US 7,551,018 B2
(45) Date of Patent: Jun. 23, 2009

(54) DECOUPLING CAPACITOR CIRCUIT

(75) Inventors: Jen Shou Hsu, Hsinchu (TW); Ming Hung Wang, Hsinchu (TW)

(73) Assignee: Etron Technology, Inc., Hsin Chu (TW)

( * ) Notice: Subject to any disclaimer, the term of this patent is extended or adjusted under 35 U.S.C. 154(b) by 94 days.

(21) Appl. No.: 11/797,057

(22) Filed: Apr. 30, 2007

(65) Prior Publication Data

US 2008/0142924 A1 Jun. 19, 2008

(30) Foreign Application Priority Data

Dec. 19, 2006 (TW) .............................. 95147563 A

(51) Int. Cl.
*G05F 1/10* (2006.01)

(52) U.S. Cl. ...................................... 327/536; 257/303

(58) Field of Classification Search .................... None
See application file for complete search history.

(56) References Cited

U.S. PATENT DOCUMENTS 6,373,328 B2 * 4/2002 Rapp ........................... 327/536
6,570,434 B1 * 5/2003 Hsu et al. ..................... 327/536

* cited by examiner

*Primary Examiner*—An T Luu
(74) *Attorney, Agent, or Firm*—Muncy, Geissler, Olds & Lowe, PLLC

(57) ABSTRACT

The invention discloses a decoupling capacitor circuit, comprising a plurality of coupled deep trench capacitors connected in series and a plurality of push-pull circuits. The decoupling capacitor circuit controls the voltage across each deep trench capacitor via the push-pull circuit so that it will not be influenced by the defect (leakage current) of the deep trench capacitor or the bias voltage of the parasitic devices.

18 Claims, 10 Drawing Sheets

DECOUPLING CAPACITOR CIRCUIT

BACKGROUND OF THE INVENTION (a) Field of the Invention

The invention relates to a decoupling capacitor circuit, and particularly to a high-voltage tolerable decoupling capacitor circuit by implementing a deep trench capacitor.

(b) Description of the Related Art

As technology changes everyday and progresses constantly, the demand for better functionality and higher integration of a die is ever increased as well. Traditionally, the power de-coupling capacitor of a die is implemented with a gate oxide capacitor. However, the gate oxide capacitor occupies such large die area that it cannot satisfy the demand for higher integration.

BRIEF SUMMARY OF THE INVENTION

In light of the above mentioned problem, one object of the invention is to provide a decoupling capacitor circuit that reduces the die area occupied by the gate oxide capacitor.

According to one embodiment of the invention, a decoupling capacitor circuit is provided. The decoupling capacitor circuit comprises a plurality of deep trench capacitors connected in series. Each of the deep trench capacitors comprises at least one deep trench capacitor cell. The coupling portion of every two deep trench capacitors forms a node and the bias of each node is set within a pre-determined voltage range. When the decoupling capacitor circuit is utilized in a die, a high voltage is shared among a plurality of deep trench capacitors and the overall voltage durability of the deep trench capacitor is increased. Therefore, not only the problem of occupying large die area by the traditional gate oxide capacitor technology but also the insufficient voltage durability of a single deep trench capacitor is solved.

According to another embodiment of the invention, a decoupling capacitor circuit is provided. The decoupling capacitor circuit comprises N deep trench capacitors connected in series, a voltage divider, and (N-1) push-pull circuits where N is an integer larger than 1. The coupling portion of every two deep trench capacitors forms a node and a total of (N-1) nodes are formed. The voltage divider generates 2(N-1) reference voltages. The (N-1) push-pull circuits selectively adjust the voltage values of the (N-1) nodes according to the 2(N-1) reference voltages. Thus, the bias of each node is set within a pre-determined voltage range. By such design, the voltage across each of the deep trench capacitors connected in series can be identical or within a pre-determined proportion to each other and thus is not influenced by the parasitic device probably generated or the defect (leakage current) of the capacitor. Such circuit design solves the problem of the voltage durability of the traditional decoupling capacitor according to the prior art, it also solves the problem of the variation of the voltage across the capacitor due to the parasitic device or the defect of the deep trench capacitor.

DETAILED DESCRIPTION OF THE INVENTION

The current deep trench capacitor (or referred to as "Deep Trench capacitor" or "DT capacitor") is utilized in the memory cell of dynamic random access memory, hereinafter referred to as "DRAM", in which the deep trench capacitor occupies small area but has large capacitance. For example, in some 0.11 micrometer, hereinafter referred to as "micron", DRAM process, during layout under the condition of occupying the same area, the capacitance of a deep trench capacitor can be 56 times the capacitance of a thick gate oxide capacitor or 37 times the capacitance of a thin gate oxide capacitor. Therefore, if the deep trench capacitor is used as a decoupling capacitor to replace the gate oxide capacitor, the overall die area occupied by the gate oxide capacitor can be greatly reduced and the die integration can be increased.

Since the DRAM memory cell is utilized in low voltage applications, the dielectric thickness of most deep trench capacitors is designed to be thin and therefore the tolerable voltage is very low. If the deep trench capacitor is utilized in a power, operating in the high voltage range, as the power decoupling capacitor, it cannot withstand the high voltage and cause the reliability to decrease.

Figure 1A:
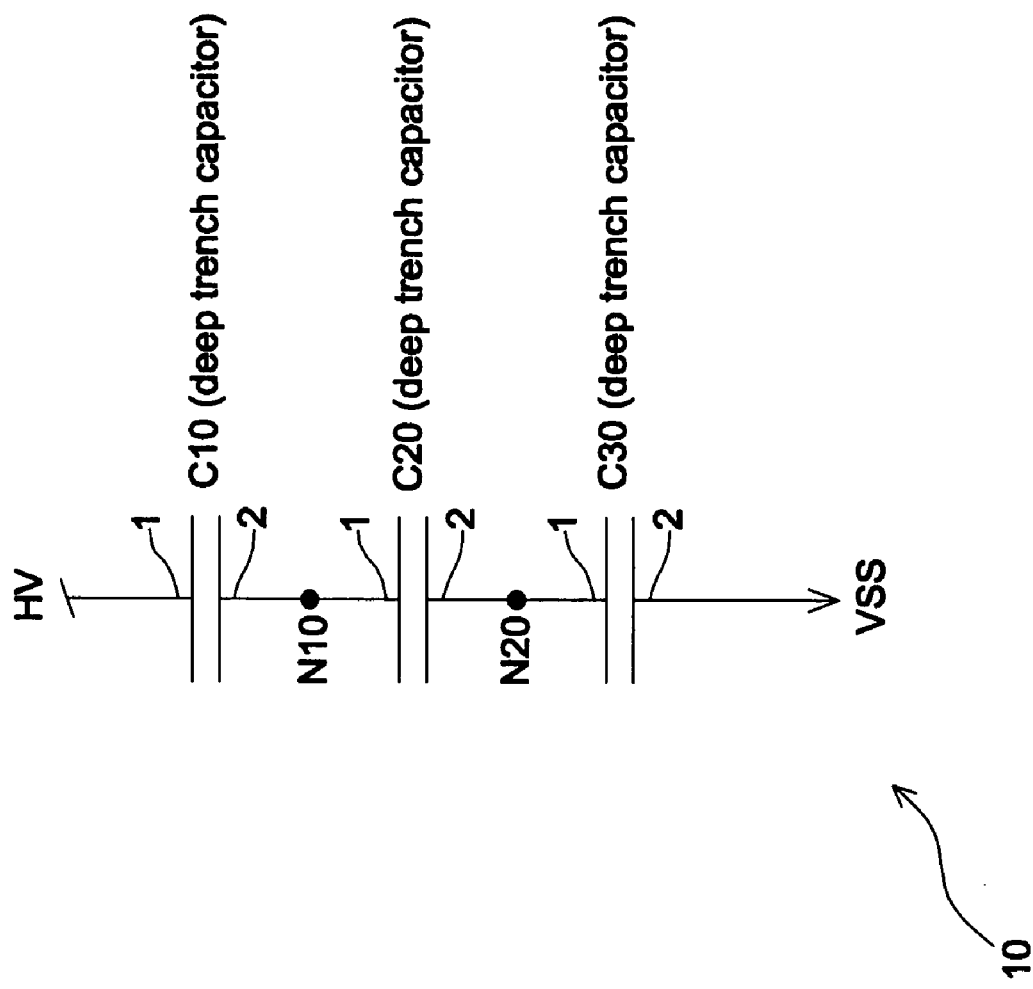
FIG. 1A shows a schematic diagram illustrating a decoupling capacitor circuit according to one embodiment of the invention.

In order to resolve the problem of the tolerable voltage of the deep trench capacitor, one embodiment of the invention provides a high-voltage tolerable decoupling capacitor circuit, comprising N deep trench capacitors connected in series where N is an integer larger than 1. The decoupling capacitor circuit utilizes N deep trench capacitors to evenly share the voltage so as to increase the overall tolerable voltage of the decoupling capacitor circuit. For instance, FIG. 1A shows one embodiment of the decoupling capacitor circuit 10 of the invention. One end of the decoupling capacitor circuit 10 is coupled to a first voltage level (high voltage level) HV while the other end of the decoupling capacitor circuit 10 is coupled to a second voltage level (low voltage level or ground) VSS. The decoupling capacitor circuit 10 comprises a first deep trench capacitor C10, a second deep trench capacitor C20, and a third deep trench capacitor C30. Each of the deep trench capacitors C10, C20, and C30 comprises a first terminal and a second terminal. The first terminal of the first deep trench capacitor C10 is coupled to the first voltage level HV and the second terminal is coupled, in series, to the first terminal of the second deep trench capacitor C20 to form a node N10. The second terminal of the second deep trench capacitor C20 is coupled, in series, to the first terminal of the third deep trench capacitor C30 to form a node N20. The second terminal of the third deep trench capacitor C30 is coupled to the second voltage level VSS. In this circuit, the pre-set voltage of the nodes, N10 and N20, is V(N10)=2×V(N20), that is, the voltage across each deep trench capacitor C10, C20, C30 is identical.

It should be noted that another embodiment of the invention provides a high-voltage tolerable decoupling capacitor circuit, comprising N deep trench capacitors connected in series. The first terminal of the Nth deep trench capacitor is coupled to the second terminal of the (N-1)th deep trench capacitor and the second terminal of the Nth deep trench capacitor is coupled to the second voltage level VSS. Besides, every deep trench capacitor comprises a plurality of deep trench capacitor cells connected in parallel. Obviously, if the voltage tolerance (durability) of a single deep trench capacitor cell is increased in the future, only one deep trench capacitor cell is needed to form the deep trench capacitor.

Referring to FIG. 1A, it is assumed that the first voltage level HV is equal to 3.6 volts, hereinafter referred to as "V", and the second voltage level VSS is equal to 0V. The tolerable voltage of a single deep trench capacitor used in the DRAM memory cell is also assumed to be only 1.5V. Thus, the dielectric of a single deep trench capacitor cannot withstand the 3.6V high voltage. As the characteristics of the deep trench capacitors C10, C20, and C30 of the decoupling capacitor circuit 10 according to one embodiment of the invention are the same and C10=C20=C30=1250 pF, the tolerable voltage is also 1.5V. Then under the normal condition, after the three deep trench capacitors C10, C20, and C30 are connected in series, each deep trench capacitor evenly shares 1.2V. Therefore, the decoupling capacitor circuit 10 of the invention can be utilized in the 3.6V high voltage application to achieve the increase of the overall voltage tolerance of the deep trench capacitor. Moreover, the deep trench capacitor can be used in the high voltage range to replace the gate oxide capacitor as the decoupling capacitor. Therefore, the problem of occupying large die area by the traditional gate oxide capacitor can be solved.

Figure 1B:
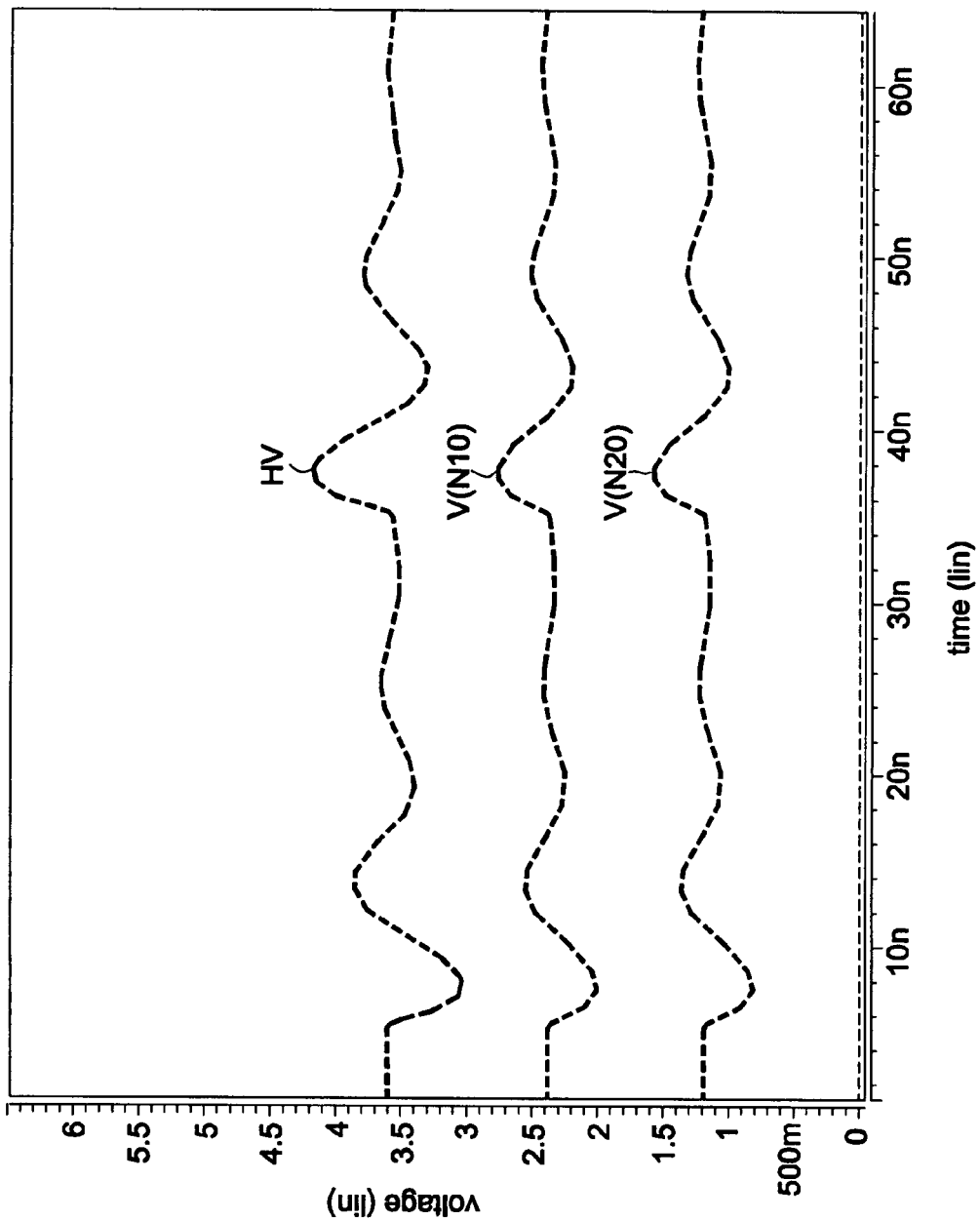
FIG. 1B shows a waveform diagram of the decoupling capacitor circuit in FIG. 1A.
Figure 1C:
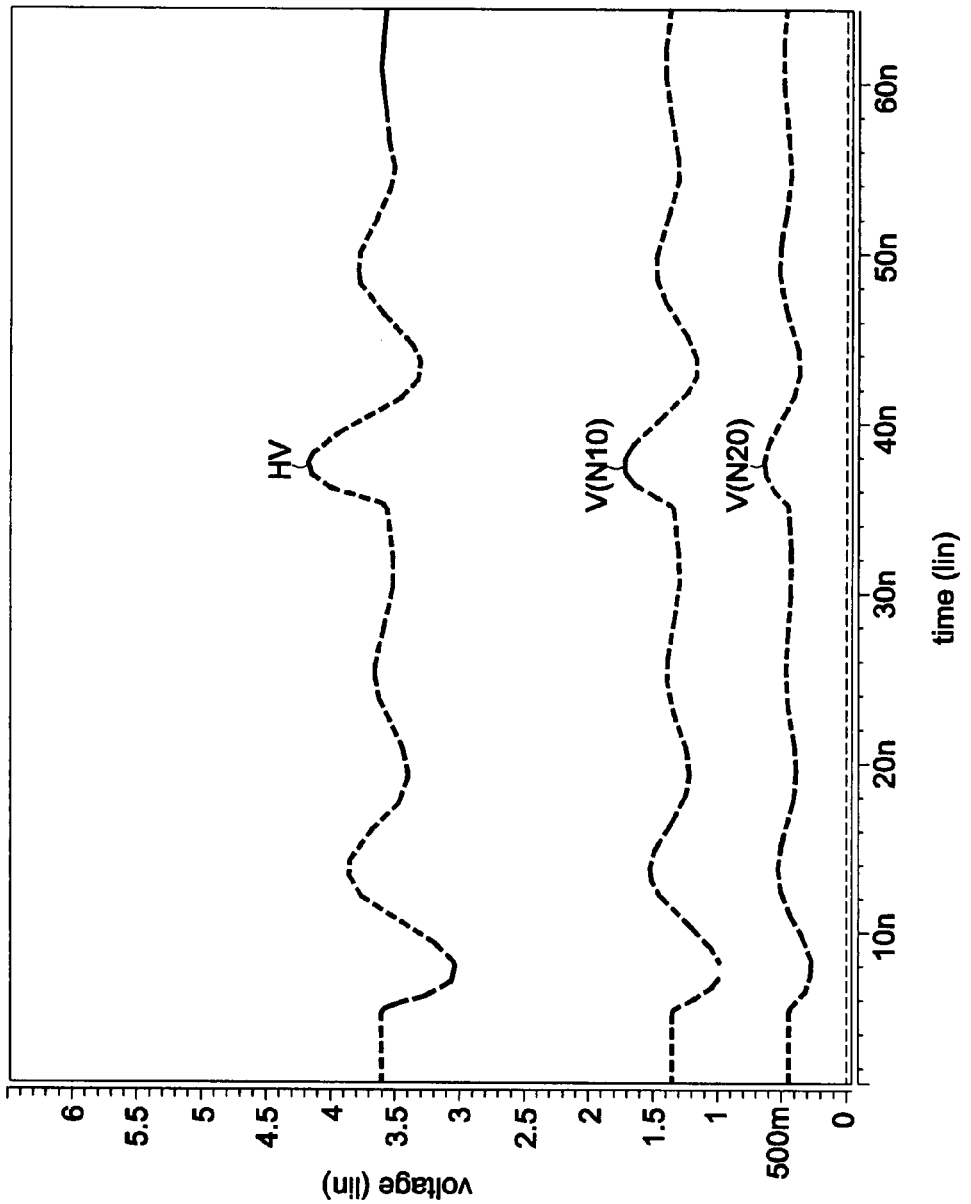
FIG. 1C shows another waveform diagram of the decoupling capacitor circuit in FIG. 1A under the influence of the parasitic bipolar transistor effect.

Under normal condition, the voltage across each of the three deep trench capacitors C10, C20, and C30 of the decoupling capacitor circuit 10 shown in FIG. 1A, should be equal to 1.2V, that is, the node voltage V(N20) is equal to 1.2V and V(N10) is equal to 2.4V, as shown in FIG. 1B. However, each of the deep trench capacitors of each DRAM comprises many deep trench capacitor cells. Defects or parasitic devices of some deep trench capacitor cells during the manufacturing process causing the flow of leakage current may result in the different voltage across the three deep trench capacitors C10, C20, and C30. For example, the voltage across the capacitor C10 becomes 2.25V, the voltage across the capacitor C20 becomes 0.9V, and the voltage across the capacitor C30 becomes 0.45V, that is, the node voltage V(N20) is equal to 0.45V and V(N10) is equal to 1.35V, as shown in FIG. 1C. Thus, the voltage across the deep trench capacitor C10 is too high (over 1.2V) and it will be burnt out.

The cause for such unequal voltage across the three deep trench capacitors as mentioned above together with a solving method according to one embodiment of the invention will be described in the following.

Figure 1D:
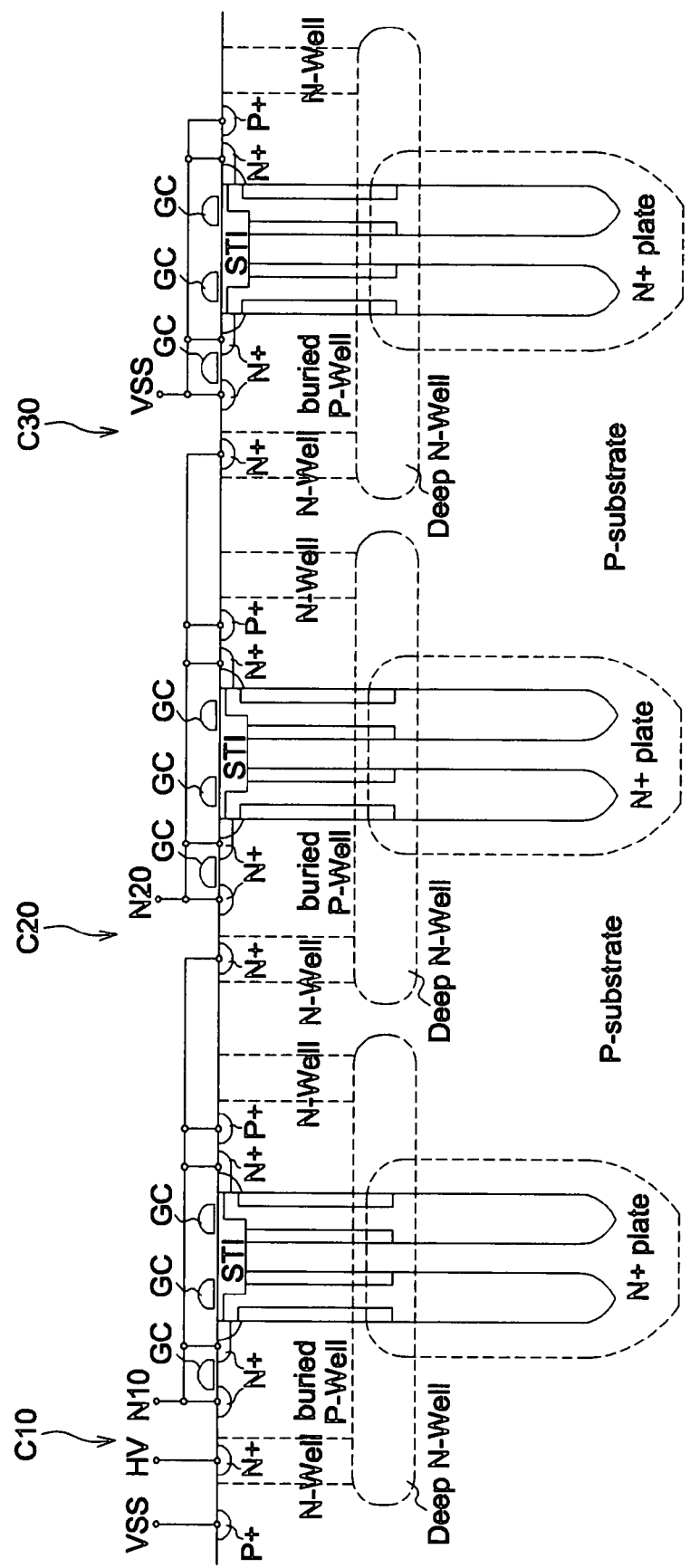
FIG. 1D shows a structural cross-section diagram of the decoupling capacitor circuit in FIG. 1A.

FIG. 1D shows a structural cross-section diagram of the decoupling capacitor circuit shown in FIG. 1A. The structural cross-section diagram illustrates the three deep trench capacitors C10, C20, and C30 connected in series and the structure of each deep trench capacitor C10, C20, C30 complies with the traditional technology and further details will not be repeated herein.

Figure 1E:
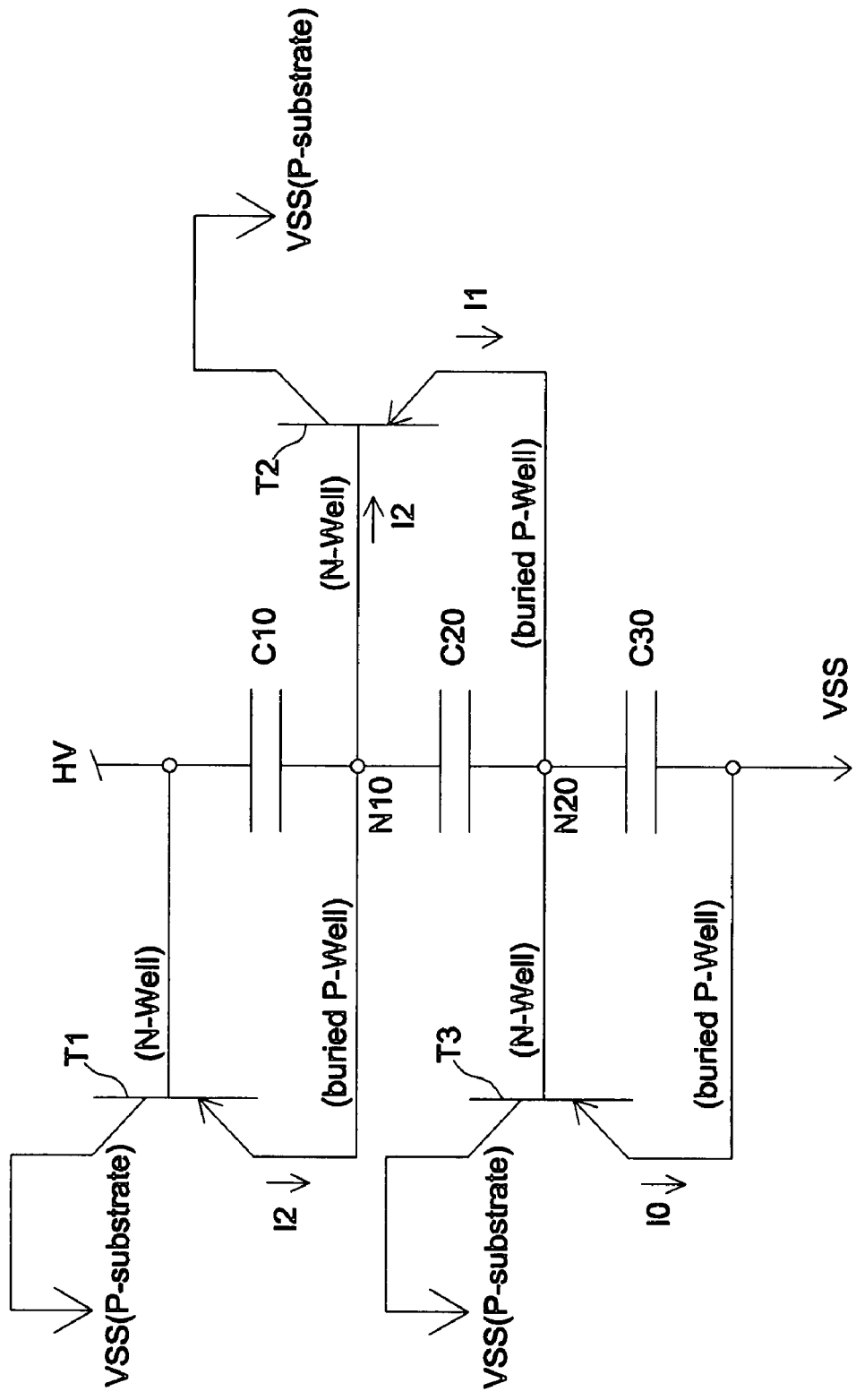
FIG. 1E shows a schematic diagram illustrating an equivalent circuit of the parasitic transistor of the decoupling capacitor circuit in FIG. 1A.

Please refer to FIGS. 1A, 1D, and 1E simultaneously. FIG. 1E shows the equivalent circuits of the parasitic bipolar transistors T1, T2, and T3 of the deep trench capacitors C10, C20, and C30, respectively. As shown in FIG. 1E, the parasitic transistors T1, T2, and T3 are PNP transistors and formed by the P-substrate, N-Well, and buried P-Well, respectively. These bipolar transistors T1, T2, and T3 are the cause of the generation of the leakage current and the variation of the voltage across the deep trench capacitor. As shown in the figure, the current I1=2×I0 while the current I2=I1+(I1+I0) =2×I0+3×I0=5×I0. Therefore, the ratio of the voltage across the deep trench capacitors C10, C20, and C30 is V(C10):V(C20):V(C30)=I2:I1:I0=5:2:1. Hence, when HV=3.6V and VSS=0V, the voltages of the nodes N10 and N20 are shifted downward to approach the voltage level of the ground, V(C10)=2.25V, V(C20)=0.9V, and V(C30)=0.45V, that is, V(N10)=1.35V and V(N20)=0.45V. Thus, the voltage across the deep trench capacitor (C10) is so high to be burnt out, as shown in FIG. 1C.

Figure 2A:
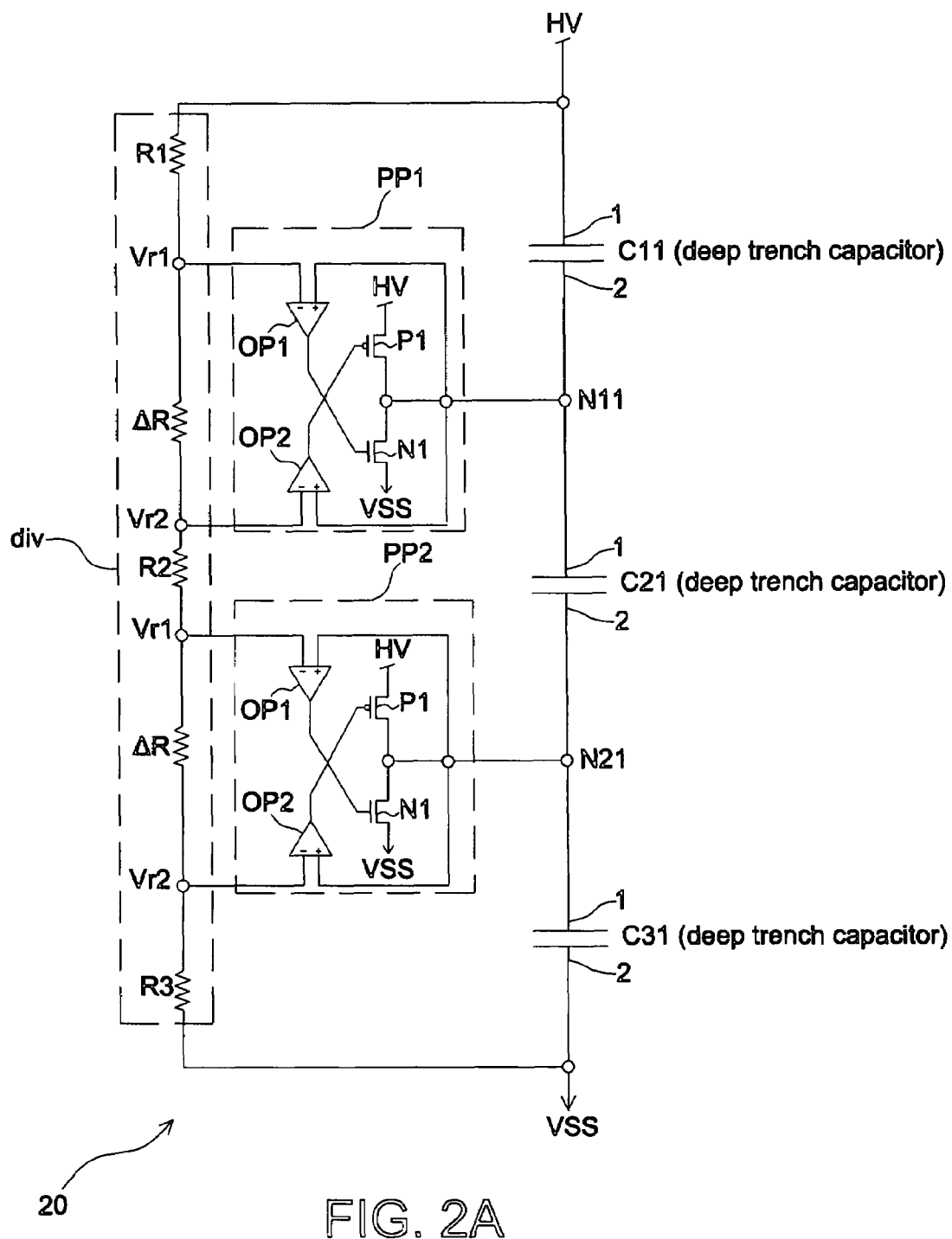
FIG. 2A shows a schematic diagram illustrating a decoupling capacitor circuit according to one embodiment of the invention.

As shown in FIG. 2A, in order to overcome the problem caused by the variation of the voltage across each of the deep trench capacitors connected in series, the decoupling capacitor circuit according to another embodiment of the invention uses active components to control the voltage across every deep trench capacitor so that the voltage across each deep trench capacitor is set within a pre-determined voltage range. The decoupling capacitor circuit comprises N deep trench capacitors connected in series, (N-1) push-pull circuits, a voltage divider (or called "divider") comprising N resistors R1~RN and (N-1) differential resistors ΔR. The coupling portion of every two deep trench capacitors forms a node so as to have a total of (N-1) nodes. The voltage divider generates 2(N-1) reference voltages and the (N-1) push-pull circuits selectively adjust the voltage values of the (N-1) nodes to be within pre-determined range according to the 2(N-1) reference voltages. The above N is an integer larger than 1.

It should be noted that the deep trench capacitor circuit 20 as shown in the figure comprises three deep trench capacitors C11, C21, and C31, two push-pull circuits PP1 and PP2, and a voltage divider comprising three resistors R1, R2, R3 and two differential resistors Δ R. For clarity, the three resistors of this embodiment of the invention are assumed to have the same resistances, R1=R2=R3. Obviously, the resistance of resistors can be changed or set in preset ratio according to the requirements for other embodiments of the invention.

For these deep trench capacitors connected in series, the first terminal of the first deep trench capacitor C11 is coupled to the first voltage level (high voltage level) HV while the second terminal of the first deep trench capacitor C11 connects in series with the first terminal of the second deep trench capacitor C21 to form a node N11. The voltage of the node N11 is set to be a first preset voltage V(N11). The second terminal of the second deep trench capacitor C21 connects in series with the first terminal of the third deep trench capacitor C31 to form a node N21 where the voltage of the node N21 is set to be a second preset voltage V(N21). The second terminal of the third deep trench capacitor C31 is coupled to the second voltage level (low voltage level or ground level) VSS. In this embodiment of the invention, the preset voltage level is V(N11)=2×V(N21), that is, the voltages across the deep trench capacitors C11, C21, and C31, respectively, are the same. In another embodiment of the invention, when the resistances of the three resistors R1, R2, and R3 are in a preset ratio, the preset voltages V(N11) and V(N21) should also be in the corresponding ratio.

One end of the push-pull circuit PP1 is coupled to one end of the resistor R1 and one end of the differential resistor ΔR, another end of the push-pull circuit PP1 is coupled to one end of the resistor R2 and the other end of the differential resistor ΔR, and another end of the push-pull circuit PP1 is coupled to the node N11. The push-pull circuit PP1 selectively adjusts the voltage of the node N11 according to the variation of the voltage level of the node N11 so that the voltage is approximately equal to the voltage level of a first preset voltage V(N11). One end of the push-pull circuit PP2 is coupled to one end of the resistor R2 and one end of the other differential resistor ΔR, another end of the push-pull circuit PP2 is coupled to one end of the resistor R3 and the other end of the other differential resistor ΔR, and another end of the push-pull circuit PP2 is coupled to the node N21. The push-pull circuit PP2 selectively adjusts the voltage of the node N21 according to the variation of the voltage level of the node N21 so that the voltage is approximately equal to the voltage level of a second preset voltage V(N21). Each of the push-pull circuits PP1 and PP2 comprises a discharging unit (or a voltage step-down circuit) and a charging unit (or a voltage boosting circuit). The discharging unit comprises a first comparison unit and a first switch. The charging unit comprises a second comparison unit and a second switch.

For clarity, only the push-pull circuit PP1 will be described in the following.

The first comparison unit of the discharging unit (the voltage step-down circuit) is implemented by an operational amplifier OP1. The inverting input terminal of the operational amplifier OP1 receives the first reference voltage Vr1, Vr1=[(R2+R3+2 Δ R)/(R1+R2+R3+2 Δ R)]×HV, while the non-inverting input terminal receives the voltage on the node N11. The first reference voltage Vr1 is compared to the voltage on the node N11 so that a first comparison result signal Ru1 is generated. The first switch is implemented by a transistor N1. For the transistor N1, the drain is coupled to the node N11, the source is coupled to the second voltage level VSS, and the gate receives the first comparison result signal Ru1. The transistor N1 selectively discharges the node N11 to reduce the voltage level of the node N11 according to the first comparison result signal Ru1 received by the gate of the transistor N1.

The second comparison unit of the charging unit (voltage boosting circuit) is implemented by an operational amplifier OP2. The inverting input terminal of the operational amplifier OP2 receives the second reference voltage Vr2, Vr2=[(R2+R3+ΔR)/(R1+R2+R3+2 ΔR)]×HV, while the non-inverting input terminal receives the voltage on the node N11. The second reference voltage Vr2 is compared to the voltage on the node N11 so that a second comparison result signal Ru2 is generated. The second switch is implemented by a transistor P1, the source of which is coupled to the first voltage level HV, the drain of which is coupled to the node N11, and the gate of which receives the second comparison result signal Ru2. The transistor P1 selectively charges the node N11 to increase the voltage level of the node N11 according to the second comparison result signal Ru2 received by the gate of the transistor P1. Hence, the voltage on the node N11 is controlled to be in the range between [(R2+R3+2ΔR)/(R1+R2+R3+2ΔR)]×HV and [(R2+R3+ΔR)/(R1+R2+R3+2ΔR)]×HV by the push-pull circuit PP1. Therefore, the goal of controlling the voltage on the node N11 to be approximately equal to the voltage level of a preset voltage V(N11) within a selectable range is accomplished.

In the voltage divider div, the resistor R1 is provided between the first voltage level HV and the discharging unit (or the voltage step-down circuit) of the push-pull circuit PP1. The resistor R2 is provided between the second voltage level VSS and the charging unit (or the voltage boosting circuit) of the push-pull circuit PP1. The differential resistor Δ R is provided between the discharging unit (or the voltage step-down circuit) and the charging unit (or the voltage boosting circuit). Thus, the first reference voltage Vr1 at one end of the resistor R1 and the second reference voltage Vr2 at one end of the resistor R2 are generated.

Furthermore, one end of the differential resistor Δ R is simultaneously coupled to the inverting input terminal of the operational amplifier OP1 and one end of the resistor R1. The other end of the differential resistor Δ R is simultaneously coupled to the inverting input terminal of the operational amplifier OP2 and one end of the resistor R2. The differential resistor Δ R provides the preset voltage shift V (Δ R)=[Δ R/(R1+R2+R3+2 Δ R)]×HV where the resistance of the differential resistor is smaller than the resistance of the resistor R1, R2, or R3. For simplicity, the resistances of the differential resistors Δ R in the push-pull amplifiers PP1 and PP2 according to one embodiment of the invention are set to be the same. In another embodiment of the invention, the resistances of the differential resistors Δ R in the push-pull amplifiers PP1 and PP2 do not have to be the same or can be set in a predetermined proportion.

The operation of the decoupling capacitor circuit 20 according to one embodiment of the invention is described in the following as an example. To simplify the description, only the node N11 will be discussed. It is assumed that HV=3.6V, VSS=0V, the characteristics and the capacitances of the deep trench capacitors C11, C21, and C31 are the same, R1=R2=R3, and V(Δ R)=0.01V (that is, the reference voltage Vr1=2.405V, Vr2=2.395V). As shown in FIG. 2A, under normal condition, the preset voltage on the node N11 is V(N11)=2.4V and the selected voltage range is 2.405V~2.395V. When defect is generated in the above mentioned deep trench capacitor C11, the leakage current flows through the deep trench capacitor C11 and the voltage V(N11) on the node N11 also changes, for example, the preset voltage is increased from 2.4V to 2.6V. The operational amplifier OP1 now compares the reference voltage Vr1=2.405V with the voltage V(N11)=2.6V to generate a comparison result signal Ru1. Since the voltage V(N11) is higher, the transistor N1 turns on its channel to conduct the current flowing to the second voltage level VSS according to the comparison result signal Ru1. The voltage level of the node N11 is decreased and discharging stops until the voltage reaches V(N11)=Vr1=2.405V. Obviously, the transistor P1 is in a turn-off state controlled by the operational amplifier OP2.

On the other hand, the node voltage V(N11) changes due to the leakage current of the parasitic bipolar transistor, for example, decreasing from the preset voltage 2.4V to 1.35V. The operational amplifier OP2 of the charging unit compares the reference voltage Vr2=2.395V with the voltage V(N11)=1.35V on the node N11 to generate a comparison result signal Ru2. Since the voltage Vr2 is higher, the transistor P1 turns on its channel to conduct the current flowing from the first voltage level HV to the node N11 according to the comparison result signal Ru2. Charging the node N11 increases the voltage level of the node N11 and charging stops until the voltage reaches V(N11)=Vr2=2.395V. Obviously, the transistor N1 is in a turn-off state controlled by the operational amplifier OP1.

According to the above description, when the voltage on the node N11 or N21 changes due to the influence of the defect or the parasitic transistor of the deep trench capacitor, the decoupling capacitor circuit 20 of the invention can adjust the voltage V(N11) or V(N21) to be within the range of [(R2+R3+Δ R)/(R1+R2+R3+2 Δ R)]×HV±V(Δ R)/2 or [R3/(R1+R2+R3+2 Δ R)]×HV±V(Δ R)/2, where the V(Δ R)=[Δ R/(R1+R2+R3+2 Δ R)]×HV.

It should be noted that, in the case of designing V(Δ R) to be very small, the push-pull circuit PP1 or PP2 can precisely maintain the voltage of the nodes N11 and N21 at the preset voltage level and thus the leakage current problem generated by the defect or the parasitic transistor of the deep trench capacitor is completely solved.

Figure 2B:
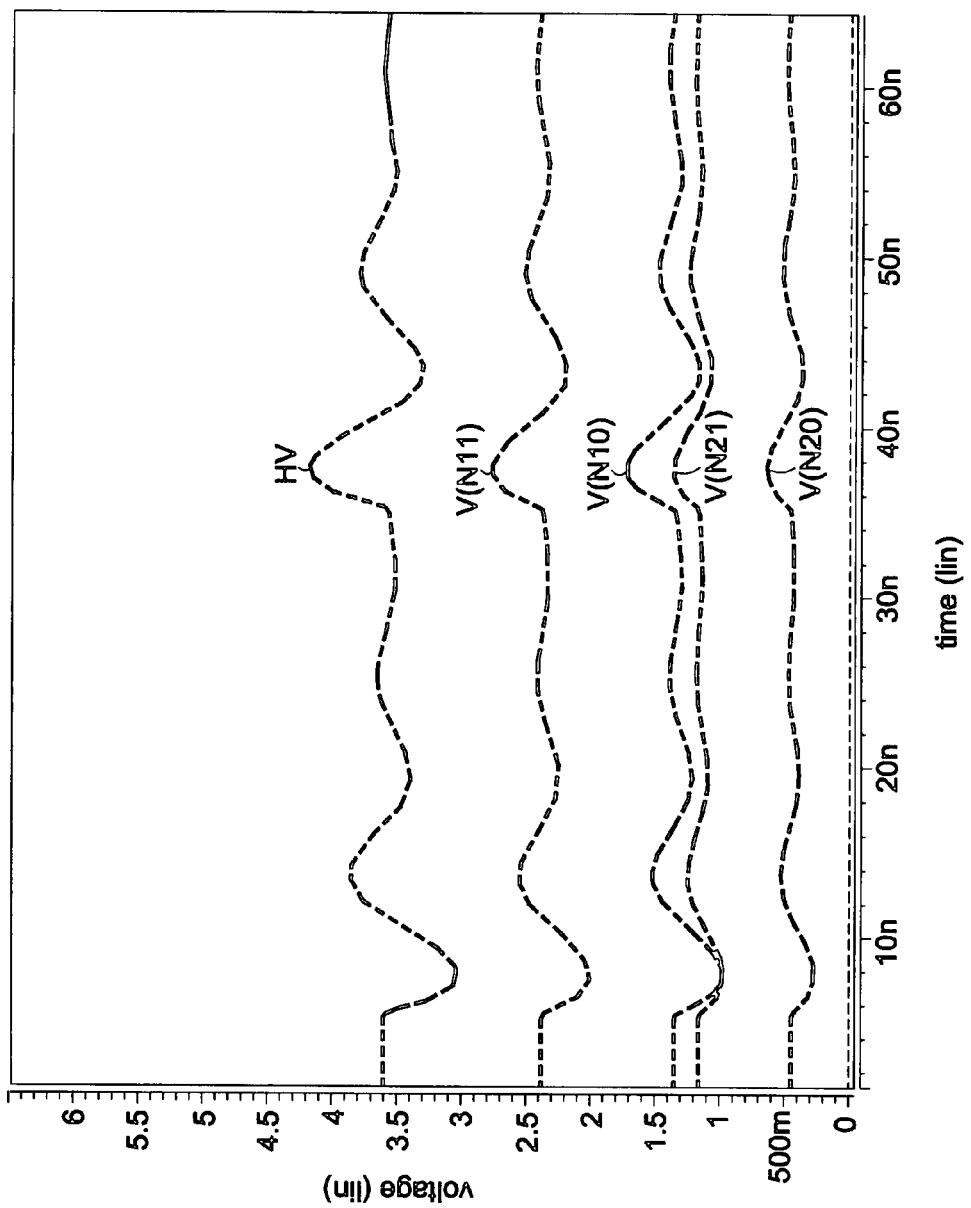
FIG. 2B shows a waveform diagram of the decoupling capacitor circuit in FIG. 2A.

Hence, the decoupling capacitor circuit 20 according to one embodiment of the invention is not influenced by the parasitic transistor and can maintain the voltage level across the deep trench capacitors C11, C21, and C31 (for example, 1.2V), that is, maintain the voltages of the nodes N11 and N21 at the preset voltages V(N11)=2.4V and V(N21)=1.2V. The voltages of the nodes N11 and N21 are not shifted to 1.35V and 0.45V, like the preset voltages V(N10) and V(N20) in the decoupling capacitor circuit 10 influenced by the parasitic transistor, as shown in FIG. 2B.

Figure 3A:
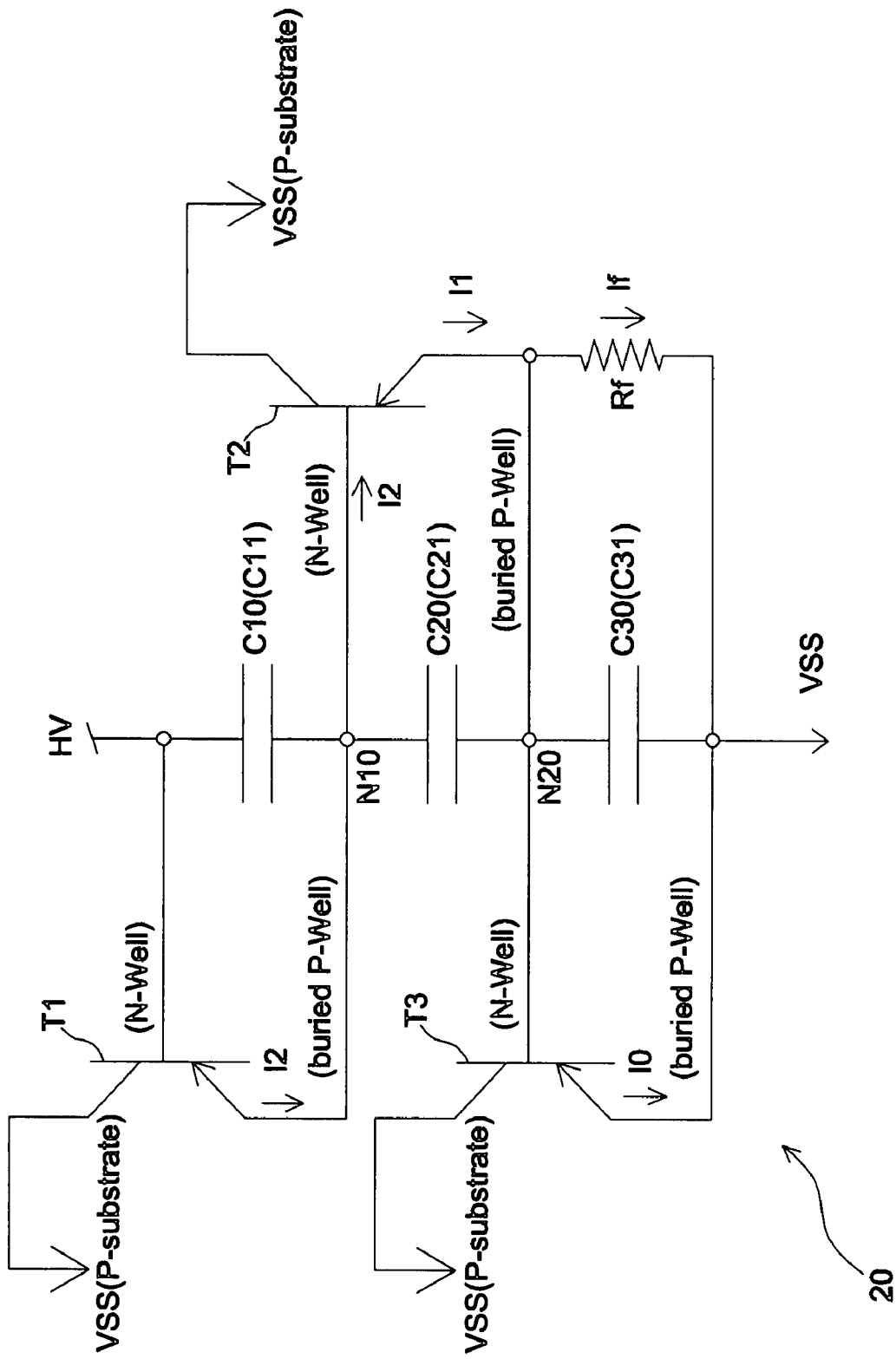
FIG. 3A shows a schematic diagram illustrating an equivalent circuit of the parasitic transistor and a resistor simulating the defect of the decoupling capacitor circuit shown in FIGS. 1A and 2A.
Figure 3B:
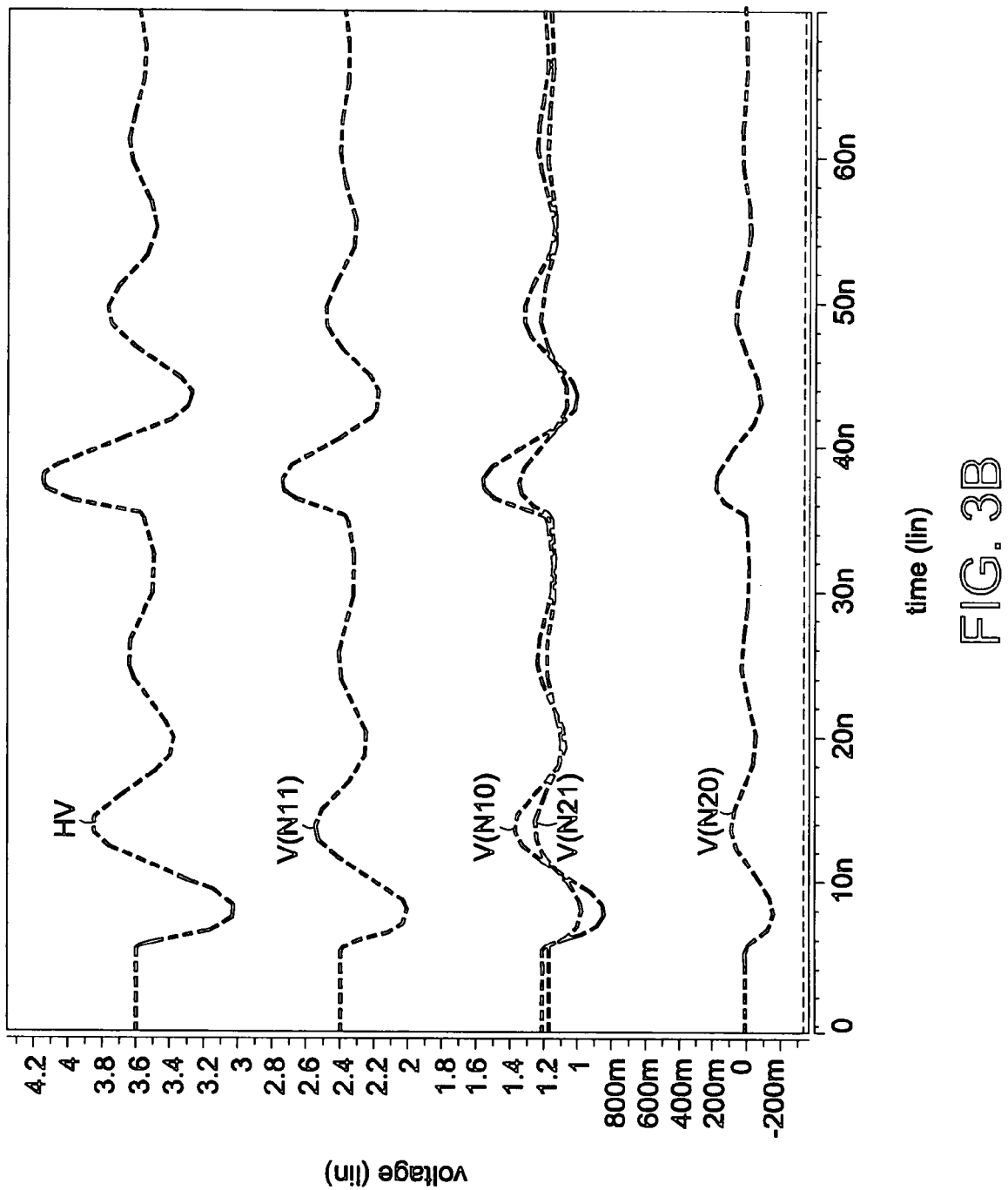
FIG. 3B shows waveform diagrams of the decoupling capacitor circuits in FIGS. 3A, 1A, and 2A.

Furthermore, please refer to FIGS. 1A, 2A, 3A, and 3B at the same time. In practical design, defect may be generated in the deep trench capacitor C30 as shown in FIG. 1A or the deep trench capacitor C31 as shown in FIG. 2A. The defect can be simulated by the resistor Rf=200 KΩ in parallel connection with the capacitor C30 or C31, as shown in FIG. 3A. When defects occur in the deep trench capacitors C30 and C31, as shown in FIG. 3B, the voltages of the nodes V(N10) and V(N20) of the decoupling capacitor circuit 10, as shown in FIG. 1A, are shifted toward the second voltage level VSS, where V(N10) is approximately equal to 1.2V and V(N20) is approximately equal to 0V. The voltages of the nodes V(N11) and V(N21) of the decoupling capacitor circuit 20, as shown in FIG. 2A, are not influenced because of the control of the push-pull circuits PP1 and PP2 and are still maintained at the voltage level of 2.4V for V(N11) and approximately 1.2V for V(N21). Besides, it is found that the node voltage V(N10) is not maintained at the center of the first voltage level HV and the node voltage V(N20) because the parasitic transistor of the deep trench capacitor causes the change of the current I2 as sown in FIG. 3A, almost twice that of the current I1, and thereby causes the shift of the voltage of the node V(N10). Therefore, the voltage across the capacitor C10 becomes the double of the voltage across the capacitor C20, because the current If flowing through the defect (resistor Rf) is assumed to be far larger than the current I0.

Figure 4:
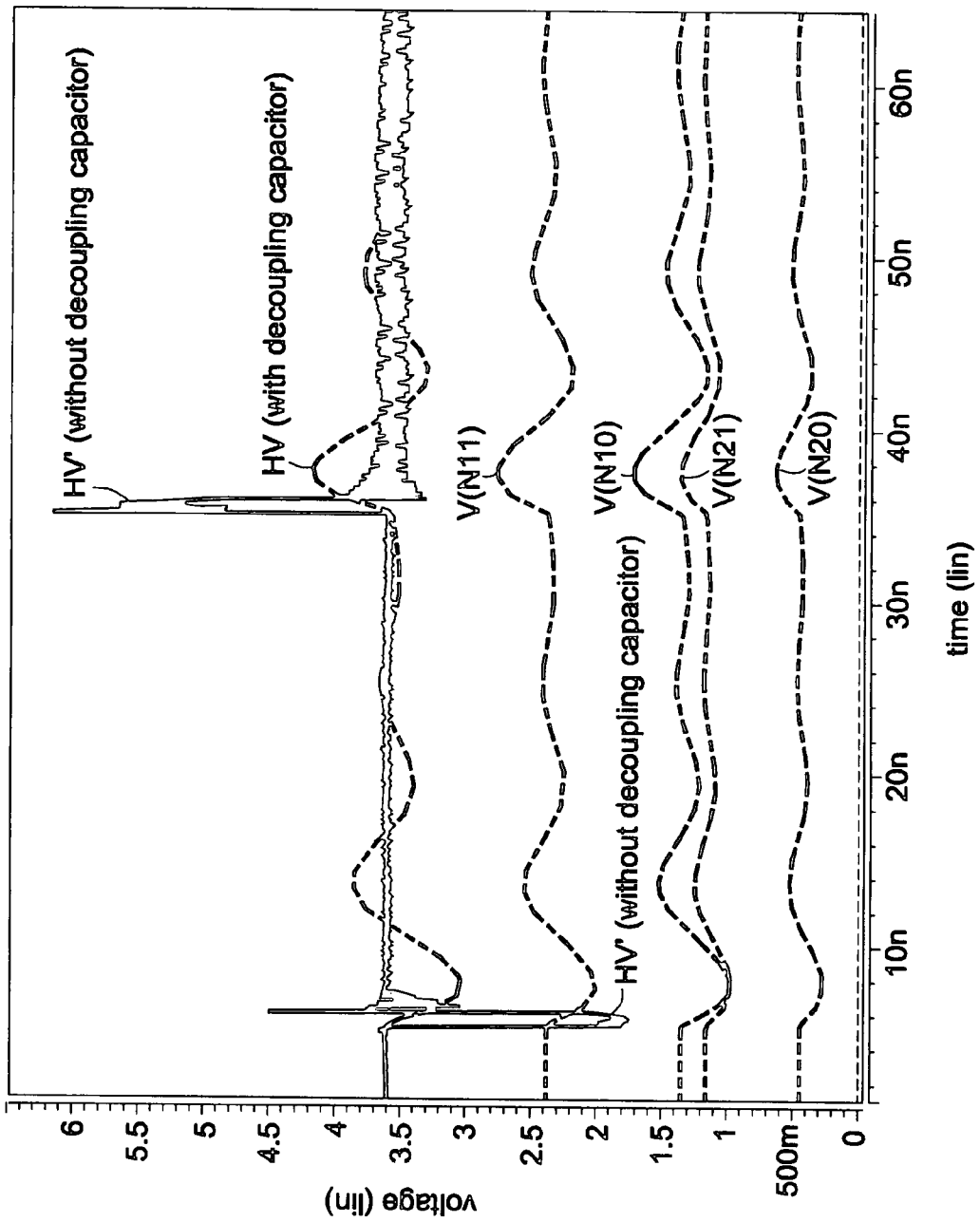
FIG. 4 shows waveform diagrams illustrating the results of simulation under three specific settings.

FIG. 4 shows waveform diagrams illustrating the results of simulation under three specific settings. The three settings are: (1) no decoupling capacitor circuit is used in the die; (2) the decoupling capacitor circuit 10 (C10=C20=C30=1250 pF) is used in the die as the decoupling capacitor; and (3) the decoupling capacitor circuit 20 (C11=C21=C31=1250 pF) is used in the die as the decoupling capacitor. It should be noted that, in the example, the deep trench capacitors of the decoupling capacitor circuits 10 and 20 are assumed to have parasitic bipolar transistor effect (that is, there is leakage current flowing). Under the first setting, there is a series-wound inductor L=6 nH between the external power VDD=3.6V and the internal power HV, causing about 200 mA current consumption between the timing 5 ns to 35 ns, as shown in FIG. 4. As shown in the figure, the overshoot voltage and the undershoot voltage of the waveform HV' without any decoupling capacitor is far larger than that of the waveform HV with a decoupling capacitor. Besides, under the second and third settings, there is almost no difference between the HV waveforms of the two settings. But, the voltages of the nodes V(N10) and V(N20) of the decoupling capacitor circuit 10 are influenced by the leakage current of the deep trench capacitor and shifted toward 1.35V and 0.45V, that causes some of the voltage across the deep trench capacitor to be too high. The voltages of the nodes V(N11) and V(N21) of the decoupling capacitor circuit 20 are maintained at the preset voltage 2.4V and 1.2V, respectively, because of the control of the push-pull circuit PP. Therefore, the voltage across the deep trench capacitor is maintained within the tolerable range.

In conclusion, applying the decoupling capacitor circuit 10 according to one embodiment of the invention in a die as the decoupling capacitor can solve the problem of occupying larger die area by the traditional gate oxide capacitor in the prior art and the insufficient voltage tolerance of the deep trench capacitor. The decoupling capacitor circuit 20 according to another embodiment of the invention solves not only the same problems of the prior art and the voltage tolerance of the capacitor, but also the problem of the variation of the voltage across the capacitor caused by the parasitic bipolar transistor effect or the defect of the capacitor.

Although the present invention has been fully described by way of examples with reference to the accompanying drawings, it should be noted that various changes and modifications will be apparent to those skilled in the art. Therefore, unless such changes and modifications depart from the scope of the present invention, they should be construed as being included therein. Various modifications and changes can be made by those who are skilled in the art without deviating from the essence of the invention.

What is claimed is:

1. A decoupling capacitor circuit, comprising:
   a plurality of deep trench capacitors connected in series and each comprising at least one deep trench capacitor cell, wherein the coupling portion of every two of the deep trench capacitors forms a node; and
   a push-pull circuit for being coupled to a set of reference voltages and selectively adjusting the voltage of one of the nodes to a pre-determined range according to the set of the reference voltages.

2. The decoupling capacitor circuit according to claim 1, wherein one end of the decoupling capacitor is coupled to a first voltage level and the other end is coupled to a second voltage level.

3. The decoupling capacitor circuit according to claim 1, wherein each deep trench capacitor comprises a plurality of deep trench capacitor cells connected in parallel.

4. A decoupling capacitor circuit, comprising:
   N deep trench capacitors connected in series and each comprising at least one deep trench capacitor cell wherein N is an integer larger than 1, and wherein each deep trench capacitor comprises a first terminal and a second terminal, the first terminal of the first deep trench capacitor is coupled to a first voltage level, and the second terminal is coupled to the first terminal of the second deep trench capacitor; while the first terminal of the Nth deep trench capacitor is coupled to the second terminal of the (N-1)th deep trench capacitor and the second terminal of the Nth deep Wench capacitor is coupled to a second voltage level and wherein the coupling portion of every two of the deep trench capacitors forms a node; and
   a push-pull circuit for being coupled to a set of reference voltages and selectively adjusting the voltage of one of the nodes to a pre-determined range according to the set of the reference voltages.

5. The decoupling capacitor circuit according to claim 4, wherein the deep trench capacitor comprises a plurality of deep trench capacitor cells connected in parallel.

6. A decoupling capacitor circuit, comprising:
   a plurality of deep trench capacitors connected in series and comprising a first deep trench capacitor and a second deep trench capacitor that are coupled to a node;
   a voltage divider for generating a set of reference voltages; and a push-pull circuit for selectively adjusting the voltage of the node to a pre-determined range according to the set of reference voltages.

7. The decoupling capacitor circuit according to claim 6, wherein the set of reference voltages comprise a first reference voltage and a second reference voltage and the push-pull circuit comprises:
- a discharging unit selectively discharging the node according to the first reference voltage and the voltage value of the node; and
- a charging unit selectively charging the node according to the second reference voltage and the voltage value of the node.

8. The decoupling capacitor circuit according to claim 7, wherein the discharging unit comprises:
- a first comparison unit for receiving the first reference voltage and the voltage value of the node to generate a first comparison result signal; and
- a first switch for selectively reducing the voltage value of the node according to the first comparison result signal.

9. The decoupling capacitor circuit according to claim 7, wherein the charging unit comprises:
- a second comparison unit for receiving the second reference voltage and the voltage value of the node to generate a second comparison result signal; and
- a second switch for selectively increasing the voltage value of the node according to the second comparison result signal.

10. The decoupling capacitor circuit according to claim 6, wherein each deep trench capacitor comprises at least one deep trench capacitor cell.

11. The decoupling capacitor circuit according to claim 6, wherein one terminal of the decoupling capacitor circuit is coupled to a first voltage level and the other terminal is coupled to a second voltage level.

12. A decoupling capacitor circuit, comprising:
- N deep trench capacitors connected in series wherein N is an integer larger than 1 and the coupling portion of every two of the deep trench capacitors forms a node so as to have a total of (N-1) nodes;
- a voltage divider for generating 2(N-1) reference voltages; and
- (N-1) push-pull circuits for selectively adjusting the voltage values of the (N-1) nodes according to the 2(N-1) reference voltages.

13. The decoupling capacitor circuit according to claim 12, wherein the voltage across each trench capacitor is identical.

14. The decoupling capacitor circuit according to claim 12, wherein the N deep trench capacitors connected in series comprise a first deep trench capacitor and a second deep trench capacitor and the voltage across the first deep trench capacitor and the voltage across the second deep trench capacitor are in proportion.

15. The decoupling capacitor circuit according to claim 12, wherein the (N-1) push-pull circuits comprise a first push-pull circuit corresponding to the first node, the 2(N-1) reference voltages comprise a first reference voltage and a second reference voltage, and the first push-pull circuit comprises:
- a voltage step-down circuit for selectively reducing the voltage value of the first node according to the first reference voltage and the voltage value of the first node; and
- a voltage boosting circuit for selectively increasing the voltage value of the first node according to the second reference voltage and the voltage value of the first node.

16. The decoupling capacitor circuit according to claim 15, wherein one terminal of the decoupling capacitor circuit is coupled to a first reference voltage level and the other terminal is coupled to a second reference voltage level.

17. The decoupling capacitor circuit according to claim 16, wherein the voltage divider comprises:
- a first resistor provided between the first voltage level and the voltage step-down circuit;
- a second resistor provided between the second voltage level and the voltage boosting circuit; and
- a differential resistor provided between the voltage step-down circuit and the voltage boosting circuit;
- wherein the voltage divider generates the first reference voltage at one terminal of the first resistor and the second reference voltage at one terminal of the second resistor.

18. The decoupling capacitor circuit according to claim 12, wherein each deep trench capacitor comprises a plurality of deep trench capacitor cells connected in parallel.

* * * * *